United States Patent [19]
Yuh

[11] Patent Number: 5,812,485
[45] Date of Patent: Sep. 22, 1998

[54] SYNCHRONOUS GRAPHIC RAM HAVING BLOCK WRITE CONTROL FUNCTION

[75] Inventor: Jong Hak Yuh, Kyoungki-do, Rep. of Korea

[73] Assignee: Hyundai Electronics Industries Co., Ltd., Ichon-shi, Rep. of Korea

[21] Appl. No.: 883,375

[22] Filed: Jun. 26, 1997

[30] Foreign Application Priority Data

Jun. 27, 1996 [KR] Rep. of Korea ......... 9624284

[51] Int. Cl.$^6$ .................................................. G11C 8/00
[52] U.S. Cl. ................. 365/230.06; 365/233; 365/194
[58] Field of Search .................... 365/233, 194, 365/230.06

[56] References Cited

U.S. PATENT DOCUMENTS 5,497,352  3/1996  Magome ................. 365/230.03
5,673,233  9/1997  Wright et al. ............. 365/233

Primary Examiner—David C. Nelms
Assistant Examiner—Trong Phan
Attorney, Agent, or Firm—Reid & Priest LLP

[57] ABSTRACT

A synchrous graphic RAM having a block write control function, includes a column decoder for selecting a column line; a column predecoder for outputting a signal for controlling the operation of the column decoder; and a column predecoder switching portion for outputting a signal for controlling the operation of the column predecoder. The predecoder switching portion has an input stage receiving a signal enabled during read or write operation so as to perform block write operation through the column decoder's enable pulsewidth control; a delay portion for variably delaying the input signal separately for normal write and block write; and an output stage for finally outputting the output signal through the delay as the column predecorder control signal.

7 Claims, 9 Drawing Sheets

SYNCHRONOUS GRAPHIC RAM HAVING BLOCK WRITE CONTROL FUNCTION

BACKGROUND OF THE INVENTION

1. Field of the Invention

The present invention relates to a synchronous graphic RAM (SGRAM) having a block write control function and, more particularly, to an SGRAM having a block write control function which variably controls the column decoder enable time during block write and normal write operation, and also controls the operation of the bitline sensing driver, in addition to performing stable block write and reducing power consumed.

2. Discussion of Related Art

Generally speaking, in order to write data in a semiconductor memory, wordlines and bitlines are first selected, and then data inputted through a data line is stored in a cell selected by the lines. For storage and reading, data is amplified through the bitline sense AMP. Methods for writing data on cells include normal write and block write.

In the normal write, data is stored in a single cell selected by one wordline and one bitline. The block write is a method of storing data in multiple cells selected by multiple bitlines intersecting with one wordline. The general procedure of storing data in a cell using such storage modes is explained below.

Above all, an external address is inputted to a predecoder through an address buffer, the output of the predecoder being inputted to a decoder. This process is performed in the same manner for column address and low address. Finally, in the cell selected by the address, data is written and read.

According to the storage modes (normal/block write), the enable pulsewidths of the column decoder switching bitline and data line are different. Therefore, separate control is required for the respective modes. According to the prior art, such a separate control is not performed, thus having the same enable pulsewidth of the column decoder in the overall cycles.

Referring to FIG. 1 which shows the prior art, column predecoder switching portion 20 of a synchronous graphic RAM which controls the enable pulsewidth of the column decoder, comprises a NAND gate NAND1 for NANDing a CASATV signal enabled during read or write in the RAM, and a signal passing through the delay portion, inverters INT20 and INT21 for inverting the signal output through NAND gate NAND1, inverter INT22 for re-inverting the signal output from inverter INT21 and outputting a final signal EXTYAT for switching the column predecoder, inverter INT23 for inverting a fed back signal of the final signal output from inverter INT22, a delay portion 10 for receiving the output of inverter INT23 (through port A), delaying it for a predetermined time, and outputting the delayed signal to one side port (B) of NAND gate NAND1, inverters INT24, INT25 and INT26 for commonly receiving and inverting the output of delay portion 10, an NMOS transistor N20 for receiving the output of inverter INT24 through the gate, one port being connected to the output of inverter INT20, a PMOS transistor P20 for receiving the output of inverter INT25 through the gate, one port being connected to the output of inverter INT21, and an NMOS transistor N21 for receiving the output of inverter INT26 through the gate, one port being connected to the output of inverter INT21.

As shown in FIG. 2, delay portion 10 includes inverters INT11, INT12, INT13 and INT14 for inverting the signal input through input port A. The number of the inverters can be changed according to the designer's intention. Between the respective inverters INT11–INT14, capacitors may be provided to control the delay.

The operation of column predecoder switching portion 20 as constructed above is performed as indicated below.

Signal CASATV input to NAND gate NAND1 is a signal enabled during a read or write operation in the RAM, and activated HIGH, as stated before. Initially, signal CASATV is input LOW, and accordingly signal EXTYAT finally output via NAND gate NAND1 and inverters INT20, INT21 and INT22 is LOW.

In this state, when signal CASATV is input HIGH according to the read/write command, signal EXTYAT becomes HIGH through NAND gate NAND1 and inverters INT20, INT21 and INT22. Here, MOS transistors N20, N21, P20 all are OFF because the output of inverter INT24 is LOW, the output of inverter INT25 is HIGH, and the output of inverter INT26 is LOW. When the signal EXTYAT is output HIGH, the column predecoder controlled by the signal operates.

Signal EXTYAT is fed back to be inputted to inverter INT23, inverted LOW, inputted to delay portion 10, and delayed as many as inverters of delay portion 10. The output of delay portion 10 is inputted to inverters INT24, INT25 and INT26 which control the status of the respective MOS transistors, which are thereby turned ON. The output of signal EXTYAT is disabled LOW. It is noted through the above explanation that signal EXTYAT is enabled HIGH by signal CASATV, delayed for a time taken through inverter INT23, delay portion 10 and inverters INT24, INT25 and INT26, and finally disabled LOW.

Referring to FIG. 3, the column predecoder comprises a PMOS transistor P30 and NMOS transistor N30 whose gates are coupled to signal EXTYAT output from column predecoder switching portion 20, inverter INT30 for inverting the value of node1, an address output buffer 31 connected to one port of NMOS transistor N30 and having NMOS transistors N31, N32 and N33 for outputting an externally input address, a PMOS transistor P31 for receiving the output of inverter INT30 through the gate, one port being connected to NODE1, and an inverter INT31 for re-inverting the output of inverter INT30 and finally outputting the address output from address output buffer 31.

With the configuration, column predecoder 30 operates according to signal EXTYAT so that the address output from address output buffer 31 (here, inputs $A_i$, $A_j$, $A_k$ all are HIGH) is fed to a column decoder (not shown). If the signal EXTYAT is LOW, node1 is then precharged HIGH, and the output stage (LOW active) is disabled HIGH. Signal EXTYAT is enabled HIGH, and node1 is disabled so that the output stage is enabled LOW.

The column decoder decodes the address input, and allows a cell to be selected to store data in the memory cell. This technique will not be described herein because it departs from the scope of the invention, and is well-known by persons skilled in the art.

FIG. 4 is a circuit diagram of the bitline sense AMP/driver stage of the conventional synchronous graphic RAM, and also shows a sense AMP driving control signal (SAT). Here, the signal SAT is enabled HIGH from LOW by a row active command in a synchronous D-RAM, and rendered LOW by a precharge command.

The bitline sense AMP/driver stage comprises a bitline sense AMP driver stage 40 having a PMOS transitor P40 whose gate is connected to the output terminal of inverter INT40 for inverting signal SAT, and an NMOS transistor N40 whose gate is connected to the output terminal of inverters INT41 and INT42 for inverting signal SAT, multiple bitline sense AMP 41 for amplifying data loaded on bitlines BL/BL when PMOS transistor P40 and NMOS transistor N40 are turned ON, and a cell area 42 for storing data output from bitline sense AMP 41.

Referring to FIG. 5, the bitline sense AMP comprises first and second cross coupling latches 41-1 and 41-2 for bitline sensing by a bias voltage output from PMOS transistor P40 and NMOS transistor N40, a switching portion 41-3 for switching bitlines BL/BL and data lines DL/DL according to the potential status $Y_i$ of the column decoder, and a bitline precharge portion 41-4 for precharging bitlines BL/BL to a predetermined potential VBLP in the precharging state. With the respective components, intended data is stored in a cell.

However, there is a problem in applying both the normal write and block write modes to the memory as constructed above. In order to overcome such a problem, the column decoder enable pulsewidth in normal write must be increased to be suitable for block write. This may reduce the performance of device because the write cycle increases. If the column decoder pulsewidth conforms to the normal write, block write is not performed stably.

In writing data in the cell, the bitlines must be inverted, consuming a great amount of power. For block write, eight bitlines must be inverted because eight column decoders are enabled at the same time.

SUMMARY OF THE INVENTION

The present invention is directed to a synchronous graphic RAM with block write control that substantially obviates one or more of the problems due to limitations and disadvantages of the related art.

An objective of the present invention is to provide a synchronous graphic RAM which performs stable block write by using a signal operating by a block write command so as to control the column decoder enable pulsewidth.

Another objective of the present invention is to provide a synchronous graphic RAM which reduces power consumed during block write, by allowing the bitline sense AMP/driver stage, which supplies the bias potential to the bitline sense AMP, to turn OFF according to the block write signal.

Additional features and advantages of the invention will be set forth in the description which follows, and in part will be yapparent from the description, or may be learned by practice of the invention. The objectives and other advantages of the invention will be realized and attained by the structure indicated in the written description and claims hereof as well as the appended drawings.

To achieve these and other advantages and in accordance with the purpose of the present invention, as embodied and broadly described, a synchrous graphic RAM having block write control function is provided and comprises: a column decoder for selecting a column line; a column predecoder for outputting a signal for controlling the operation of the column decoder; a column predecoder switching portion for outputting a signal for controlling the operation of the column predecoder; the predecoder switching portion comprising: an input stage reiceiving a signal enabled during read or write operation so as to perform block write operation through the column decoder's enable pulsewidth control; a delay portion for variably delaying the input signal separately for normal write and block write; and an output stage for finally outputting the output signal through the delay as the column predecorder control signal.

Another aspect of the present invention provides a synchronous graphic RAM having a data input/output portion, a bitline sense AMP/driver stage for amplifying the data input/output, and a column decoder for selecting a column of data input or output, the bitline sense AMP driver stage comprising: a driving controller for receiving a block write signal and sense AMP driving control signal and interrupting the bias potential of PMOS transistor and NMOS transistor during block write so as to reduce power consumed during block write; a first driver for receiving the output of the driving controller and thus controlling the turning ON/OFF of the PMOS transistor; and a second driver for receiving the output of the driving controller and thus controlling the turning ON/OFF of the NMOS transistor.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

Figure 1:
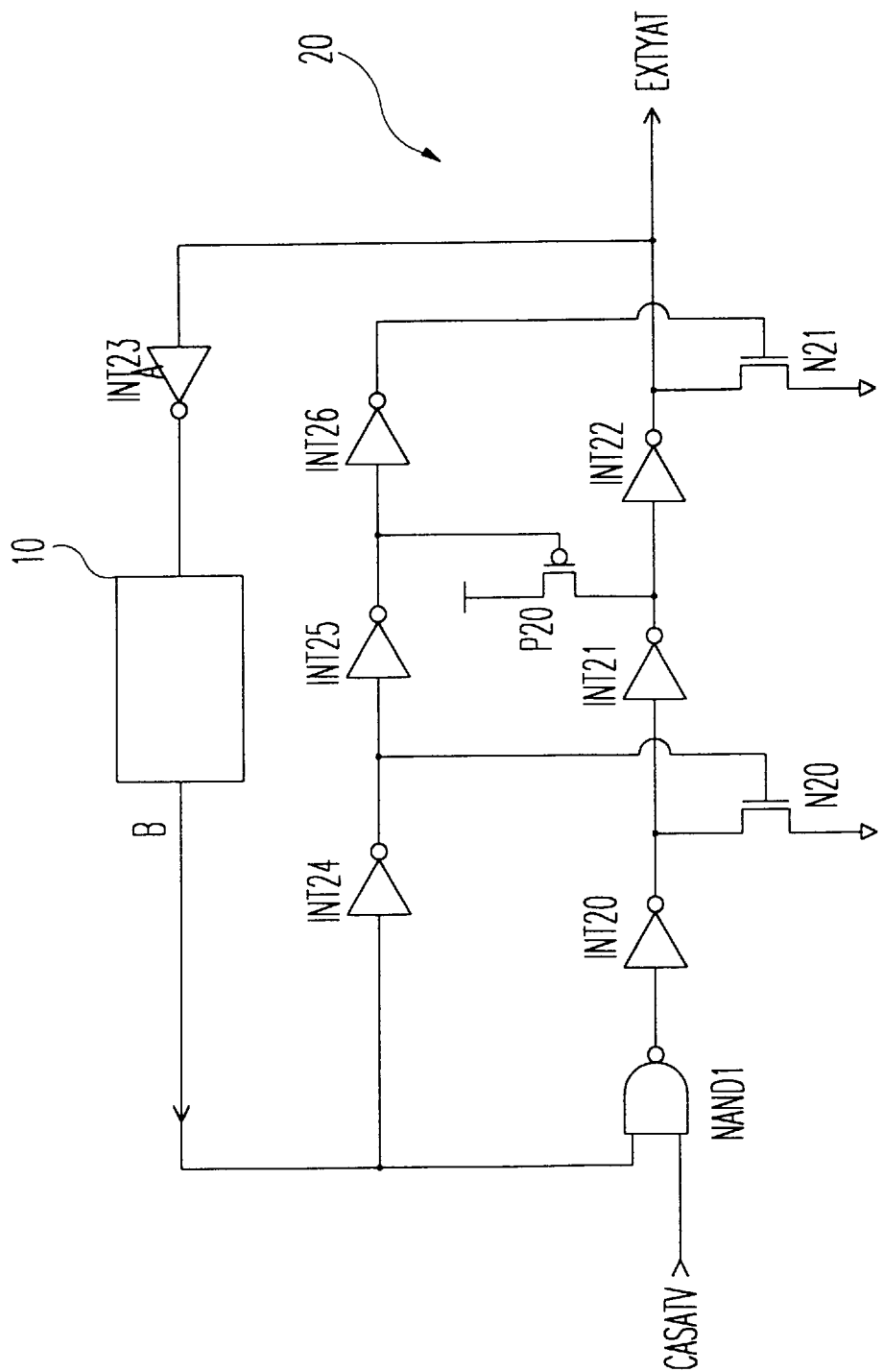
FIG. 1 is a circuit diagram showing a column predecoder switching portion of a conventional synchronous graphic RAM.
Figure 2:
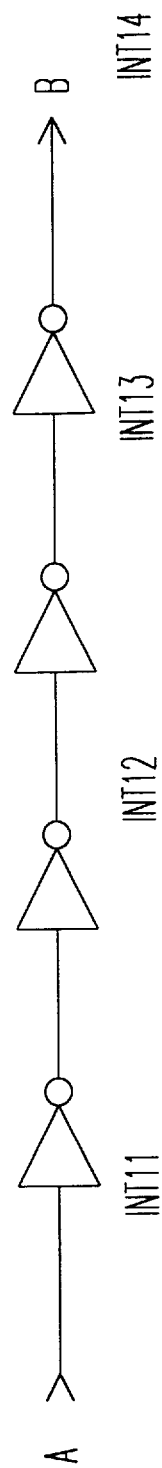
FIG. 2 is a circuit diagram showing the delay portion in the predecoder switching portion of FIG. 1.
Figure 3:
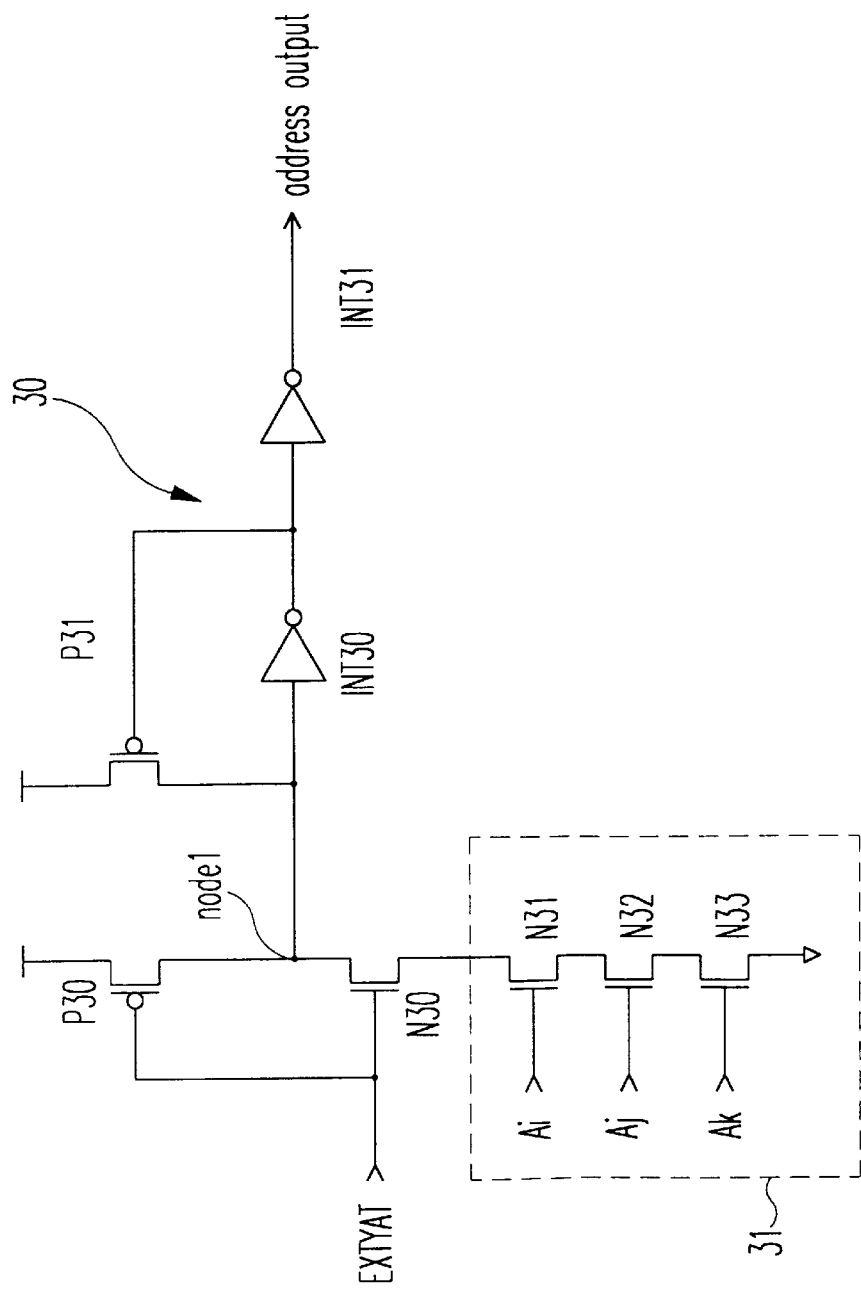
FIG. 3 is a circuit diagram showing the column predecoder of the conventional synchronous graphic RAM.
Figure 4:
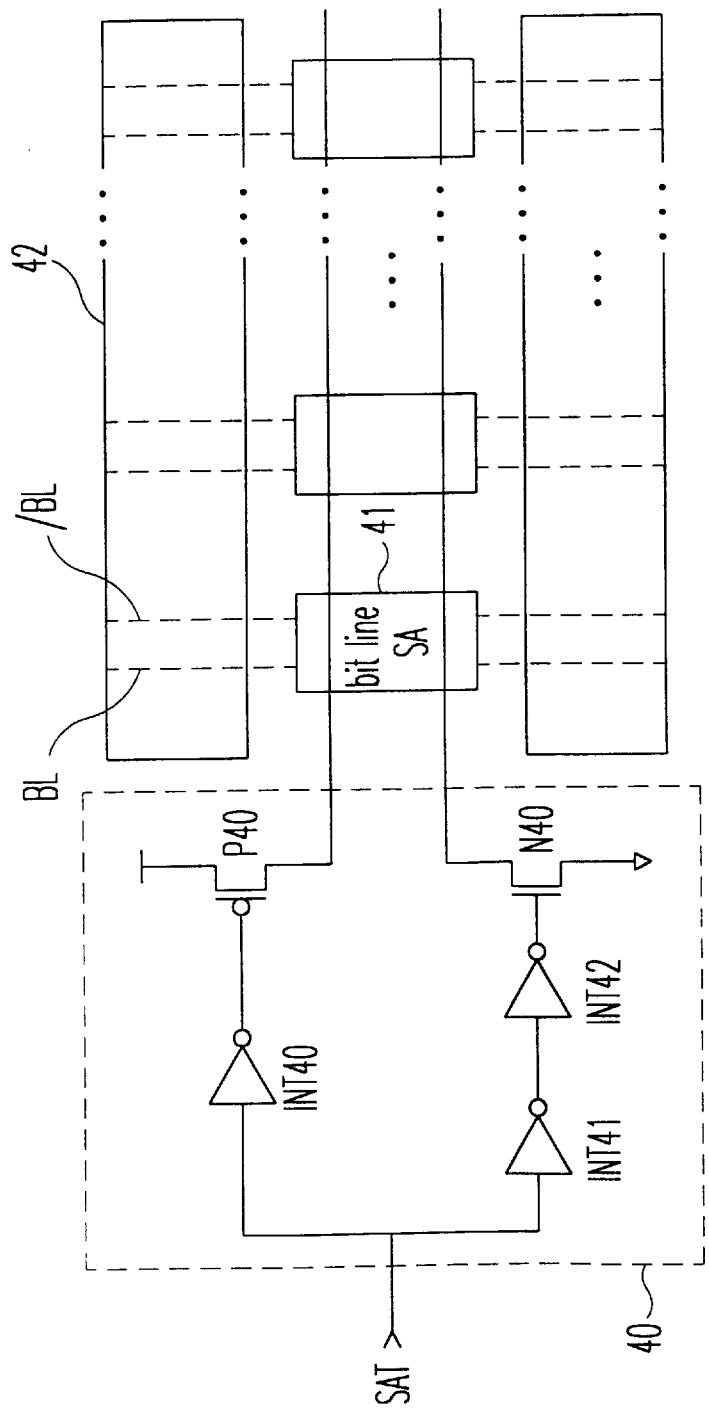
FIG. 4 is a circuit diagram showing the bitline sense AMP portion and driver stage of the conventional synchronous graphic RAM.
Figure 5:
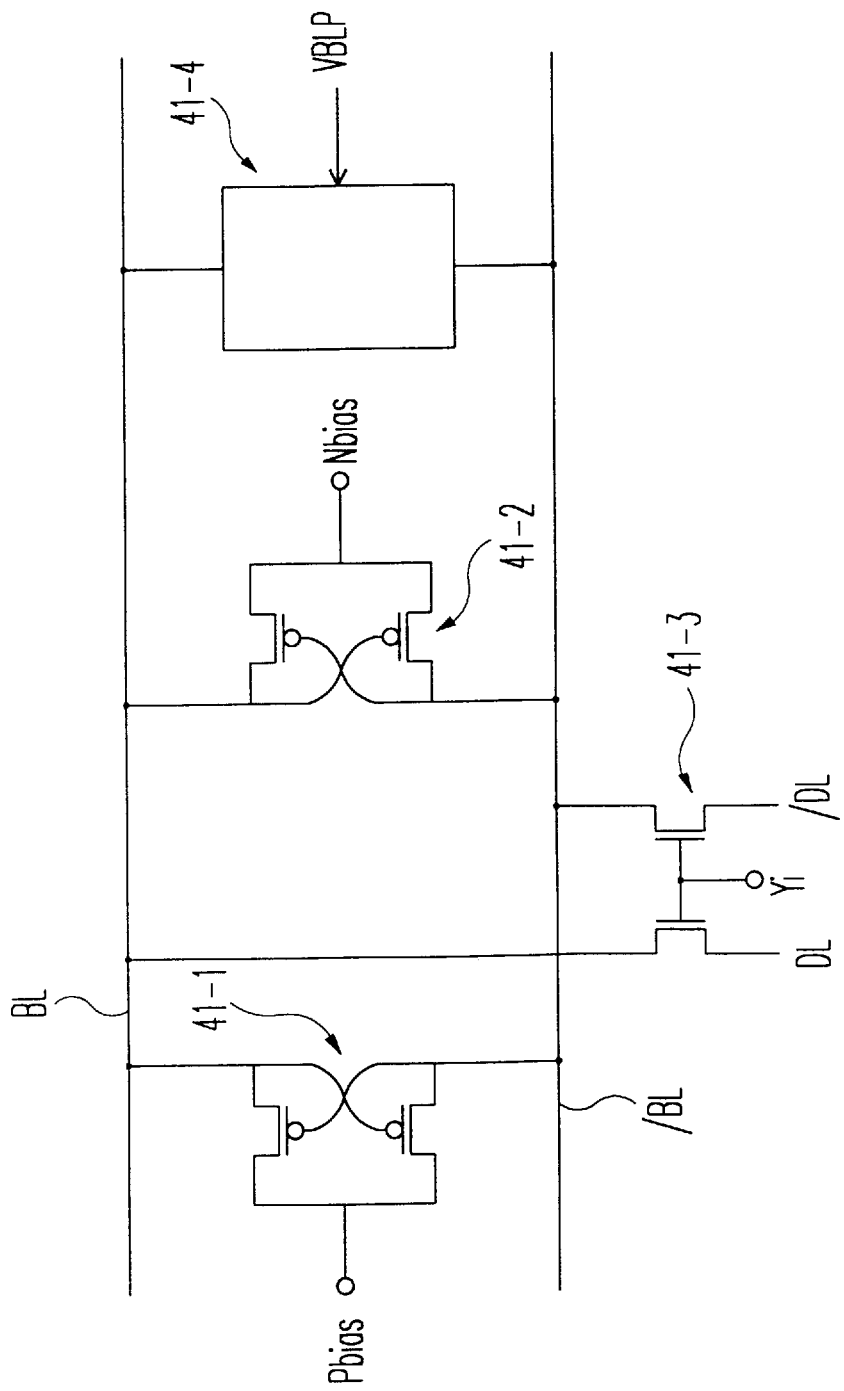
FIG. 5 is a detailed circuit diagram of the bitline sense AMP of the conventional synchronous graphic RAM.
Figure 6:
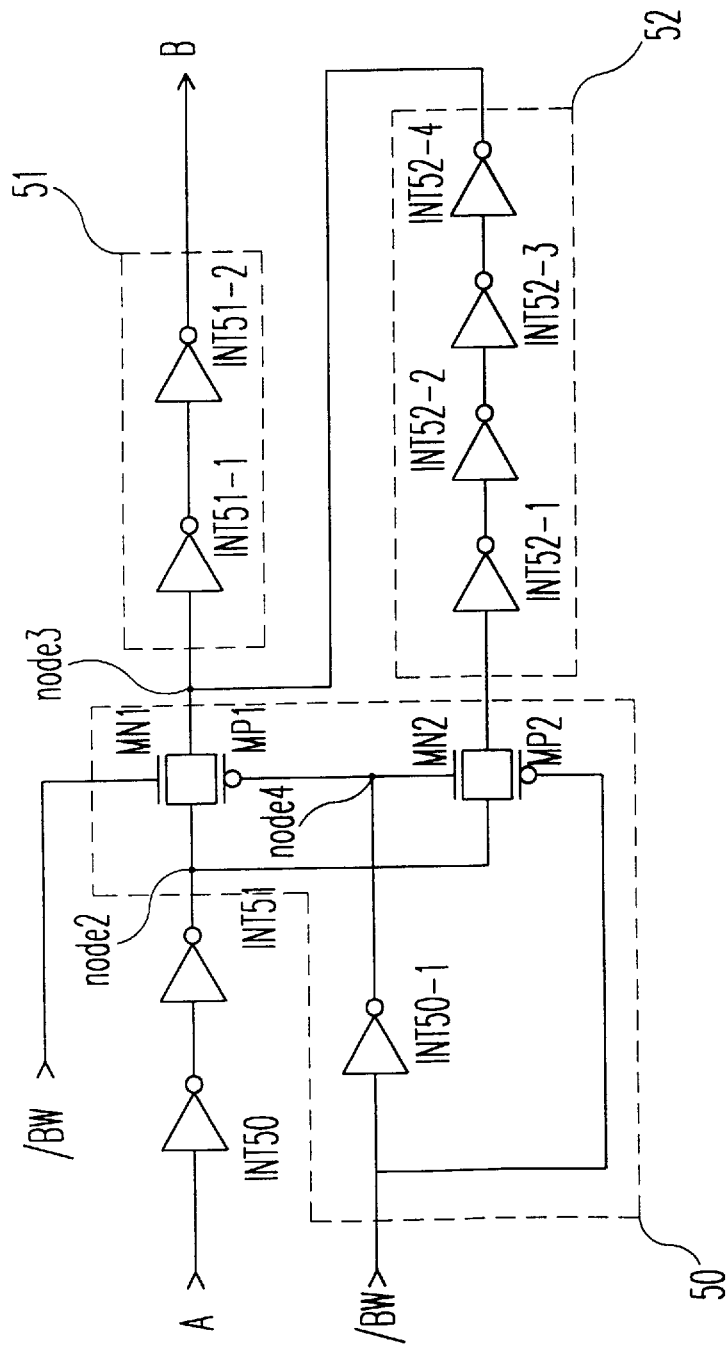
FIG. 6 is a circuit diagram showing the delay of the column predecoder switching portion of a synchronous graphic RAM according to the present invention.

A method of controlling the column decoder enable pulsewidth by controlling the delay portion of the column predecoder switching portion will be explained. FIG. 6 shows inverters INT50 and INT51 for inverting a signal input through input port A, a switching portion 50 for selectively switching delay portions 51 and 52 which delay the input signal according to a block write signal /BW, and first and second delay portions 51 and 52 for delaying the input signal for a predetermined time according to switching portion 50.

Switching portion 50 comprises first transmission gates MN1 and MP1 connected between node 2 and node 3 and controlled according to block write signal /BW in order to transmit the output of inverter INT51 to first delay portion 51, an inverter INT50-1 for inverting block write signal /BW, and second transmission gates MN2 and MP2 connected between node 4 and block write signal (/BW) input terminal and controlled according to block write signal /BW in order to transmit the output of inverter INT51 to second delay portion 52.

The final output of second delay portion 52 is fed back to the input terminal (node 3) of first delay portion 51. Delay portions 51 and 52 have inverters INT51-1 and INT51-2, and inverters INT52-1, INT52-2, INT52-3, INT52-4, respectively. The number of inverters can be adjusted according to the designer's requirement.

For the connection of transmission gates MN1, MP1, MN2, MP2, the NMOS gate of first transmission gates MN1, MP1 is connected to the block write signal input terminal, the PMOS gate is the output terminal of inverter INT50-1. The drain/source is connected between inverters INT51 and INT51-1. The NMOS gate of second transmission gates MN2,MP2 is connected to the output terminal of inverter INT50-1, the PMOS gate being to the block write signal input stage.

According to the operation of the delay portions as constructed above, if block write is carried out in the RAM, the block write signal /BW is activated LOW to be inputted to switching portion 50. Then, in switching portion 50, first transmission gates MN1,MP1 are turned OFF, and at the same time, second transmission gates MN2,MP2 are turned ON. The input signal passing through inverter INT51 enters second delay portion 52, is delayed for a predetermined time, and fed back to first delay portion 51. The input is finally outputted through port B. Therefore, for block write, switching of the column predecoder becomes slower.

The timings of the above operation are explained below with reference to FIGS. 7A–7H.

Figure 7:
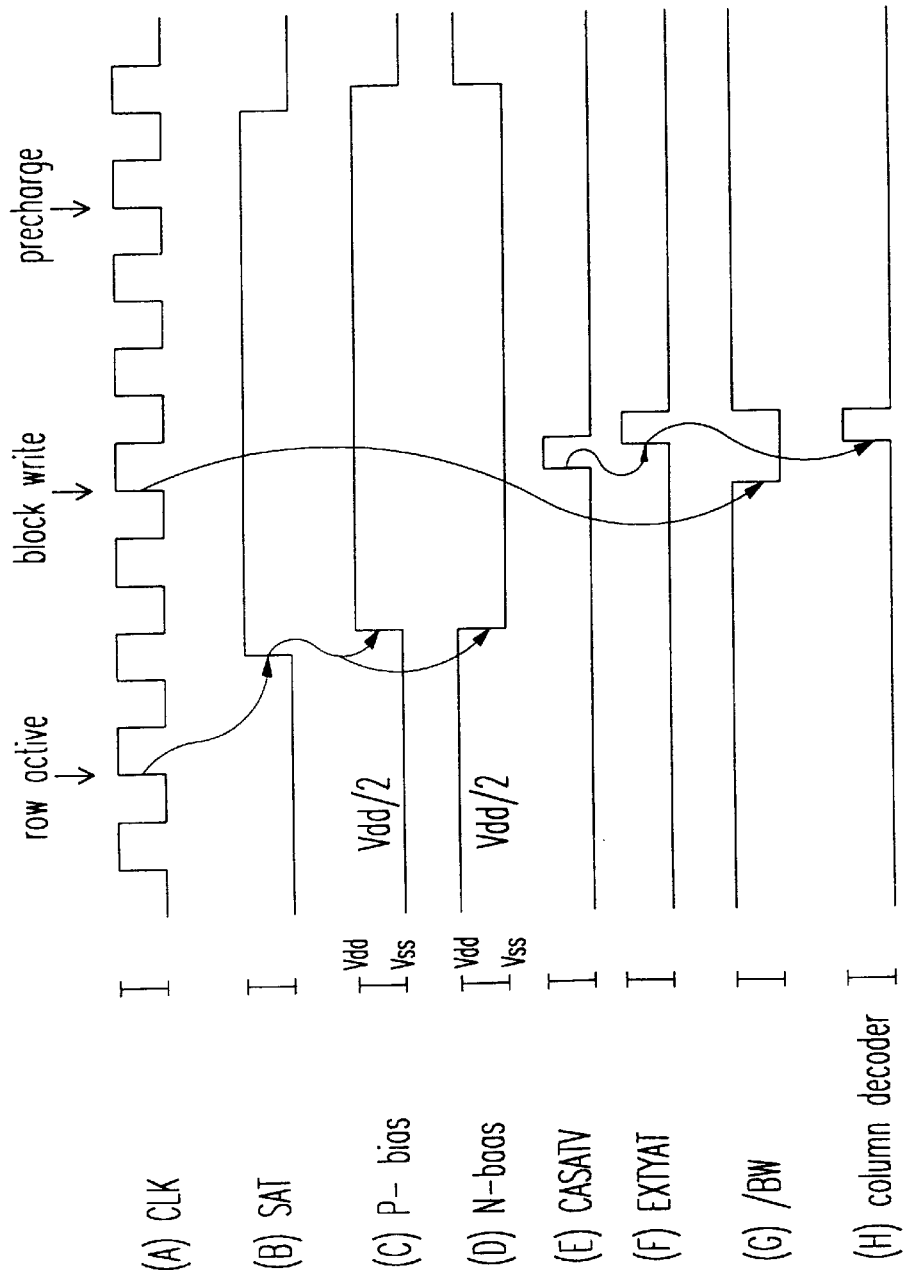
FIGS. 7A–7H shows timing diagrams explaining the operations in accordance with FIG. 6.

The system operates in synchronization with the period of clock CLK of FIG. 7A. When a LOW active command is inputted in correspondence with the rising edge of the clock, signal SAT (FIG. 7B) becomes HIGH so that currents are supplied to the P-bias (FIG. 7C) and N-bias (FIG. 7D). The voltage initially applied to the respective biases is Vdd/2.

When a block write command is inputted in this state, signal CASATV of FIG. 7E and block write /BW of FIG. 7F are activated. When the signal CASATV is activated, signal EXTYAT of FIG. 7F, a signal for switching the column predecoder, becomes active.

The address signal input to the column predecoder is first decoded and then completely decoded in the column decoder while the block write signal remains active. Depending upon whether the block write signal is active or not, the operation time of the delay portion and the active status of signals of FIGS. 7E and 7F are controlled. The enable period of the column decoder is finally controlled.

According to the input of the precharge command, one cycle of read/write is completed. The above timing diagrams show the address output from one column decoder. For block write, eight column decoders operate so that eight addresses are output at the same from the column decoder operating in the same cycle.

Figure 8:
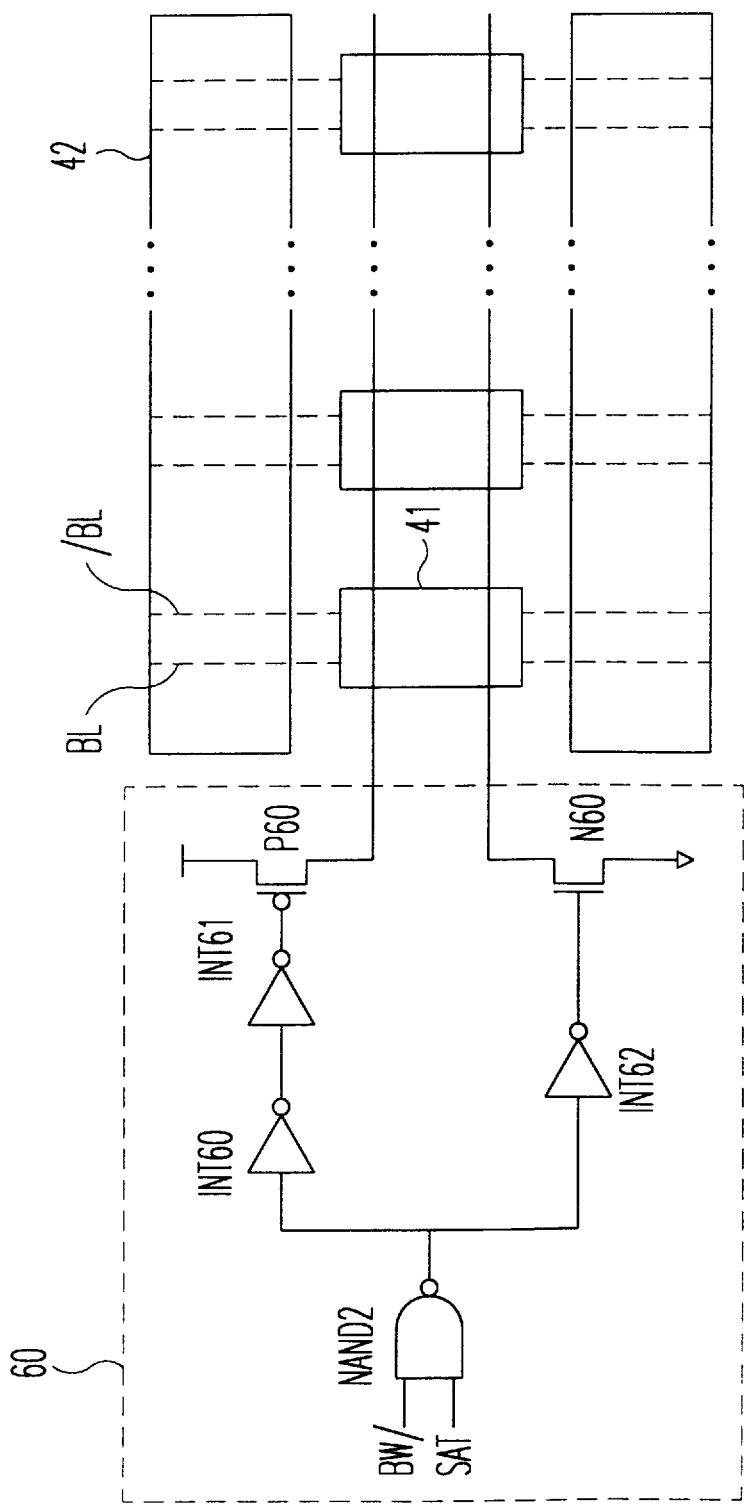
FIG. 8 is a circuit diagram of the bitline sense AMP and driver stage of the synchronous graphic RAM according to the present invention.

Meanwhile, according to a method of reducing power excessively consumed during block write by turning OFF bitline sense AMP 41 and driver stage 60, as shown in FIG. 8, the bitline sense AMP and driver stage comprise a NAND gate NAND2 for interrupting the bias potentials of PMOS transistor P60 and NMOS transistor N60 during block write after receiving the block write signal and signal SAT, inverters INT60 and INT61 for inverting the output of NAND gate NAND2 and then inputting the result to PMOS transistor P60, an inverter INT62 for inverting the output of NAND gate NAND2 and then inputting the result to NMOS transistor N60, multiple bitline sense AMPs 41 for amplifying data loaded on bitlines BL,/BL, and a cell area 42 for storing data output from bitline sense AMPs 41.

For bitline sense AMPs 41 and driver stage 60, in case of block write, the block write signal /BW is active LOW and input to NAND gate NAND2, and signal SAT is input HIGH since the RAM is currently operating.

The output of NAND gate NAND2 is output HIGH so that all the MOS transistors are turned OFF, reducing the power consumed due to block write operation at some degree.

The respective MOS transistors whose bias potentials are interrupted by NAND gate NAND2 may interrupt all or part of bitline sense AMP driver stages intersecting with one wordline. For normal write, the circuits operate in the same manner as the prior art, which will not be explained herein.

Figure 9:
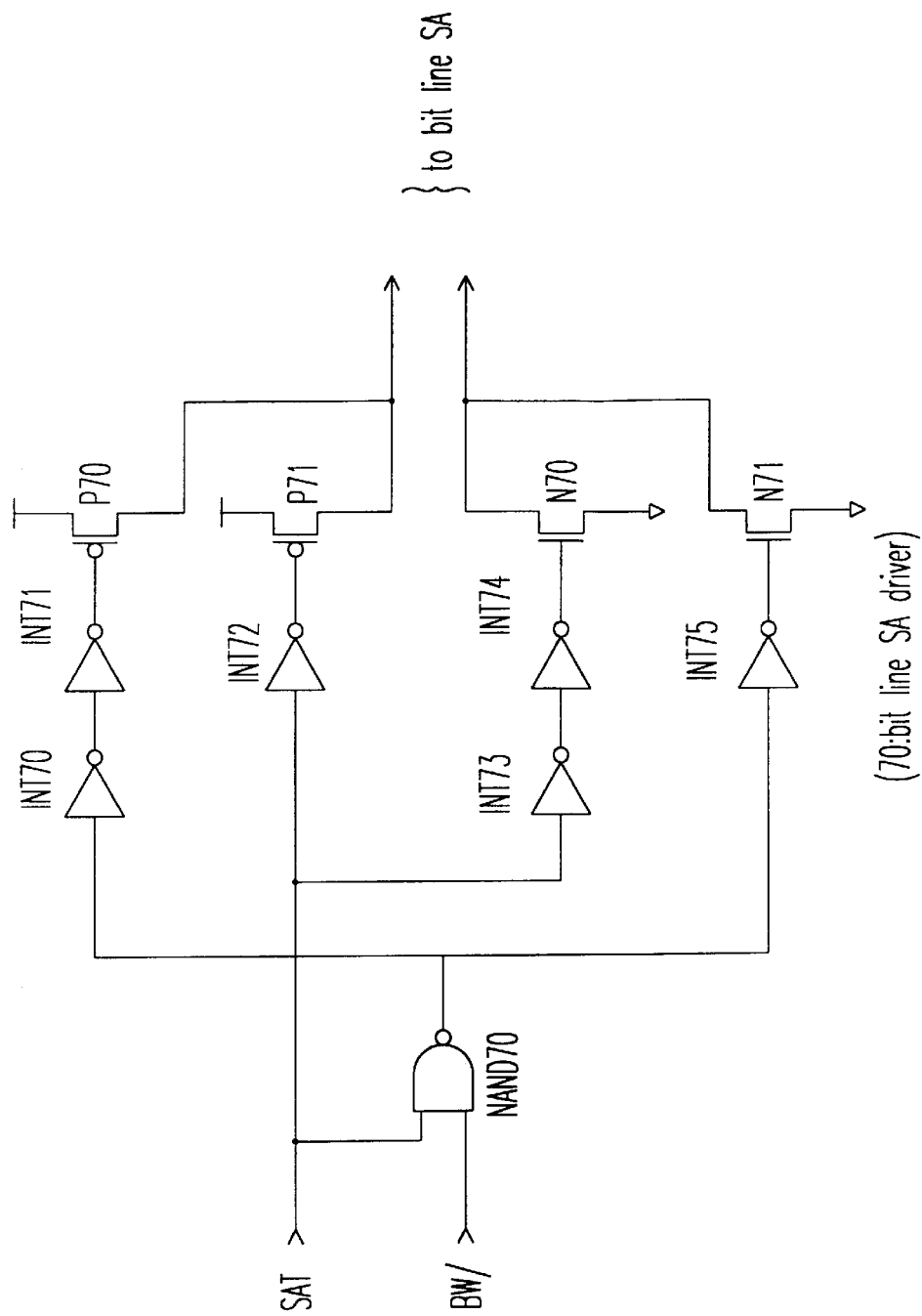
FIG. 9 is a circuit diagram of another bitline sense AMP/driver stage according to the synchronous graphic RAM of the present invention.

Another bitline sense AMP driver stage 70 for reducing power consumed in block write, as shown in FIG. 9, comprises a NAND gate NAND70 for interrupting the bias potentials of a first PMOS transistor and a second NMOS transistor for block write after receiving signal SAT and the block write signal, the first PMOS transistor P70 connected to the final output terminal of inverters INT70 and INT71 for inverting the output of NAND gate NAND70, the second PMOS transistor P71 connected to the output terminal of inverter INT72 for inverting signal SAT, a first NMOS transistor N70 connected to the final output terminal of inverters INT73 and INT74 for inverting signal SAT, and the second NMOS transistor N71 connected to the output terminal of inverter INT75 for inverting signal SAT.

With the configuration for normal write, the output of NAND gate NAND70 becomes LOW since the block write signal is not activated. Accordingly, the respective MOS transistors P70, P71, N70 and N70 are turned ON, and a voltage is supplied to the bitline sense AMP.

If the block write operation is performed in this state, the output of NAND gate is output HIGH, and the first PMOS transistor P70 and second NMOS transistor N71 are turned OFF so that only the rest MOS transistors P71 and N70 operate.

In order to comply with the purpose of the present invention by controlling the turning ON/OFF of the MOS transistors in the above method, the second PMOS transistor P71 must be much smaller than the first PMOS transistor P70 (P70>P71), and the first NMOS transistor N70 must be much smaller than the second NMOS transistor N71 (N71>N70). This is designed to prevent the P bias and N bias from flowing to very small MOS drivers P71 and N70 during block write, reducing the power consumed.

As described above, the present invention allows stable block write by elongating the enable interval of the column decoder in block write, separately for the normal write and block write for synchronous graphic RAM (SGRAM).

Further, in the present invention, the bitline sense AMP driver is temporarily turned OFF during block write in order to allow the P bias and N bias, the bitline sense AMP driving potentials, to flow. This interrupts the current supplied to the sense AMP, reducing the power consumed by the memory device.

It will be apparent to those skilled in the art that various modifications and variations can be made in the input buffer for a semiconductor memory device of the present invention without departing from the spirit or scope of the invention. Thus, it is intended that the present invention cover the modifications and variations of this invention provided that they come within the scope of the appended claims and their equivalents.

What is claimed is:

1. A predecoder switching portion for use in a synchronous graphic RAM having a block write control function, a column decoder for selecting a column line; the column predecoder for outputting a signal for controlling operation of the column decoder; and a column predecoder switching portion for outputting a signal for controlling operation of the column predecoder; the predecoder switching portion comprising:

an input stage for receiving a signal enabled during a read or write operation so as to perform a block write operation through the column decoder's enable pulse-width control;

a delay portion for variably delaying the input signal separately for normal write and block write; and an output stage for finally outputting an output signal through the delay as a column predecoder control signal.

2. The predecoder switching portion as claimed in claim 1, wherein the delay portion includes:

inverters for inverting the signal input via an input port;

a switching portion for selectively switching the delay portion which delays the input signal according to a block write signal; and first and second delays for delaying the input signal for a predetermined time according to the switching portion.

3. The predecoder switching portion as claimed in claim 2, wherein the switching portion includes:

a first transmission gate controlled according to a status of the block write signal for transmitting the output of the inverter to the first delay;

an inverter for inverting a block write signal input; and a second transmission gate connected between the block write signal input stage and controlled according to a status of the block write signal for transmitting the output of the inverter to the second delay.

4. A bitline sense AMP/driver stage for use in a synchronous graphic RAM having a data input/output portion, the bitline sense AMP/driver stage for amplifying the data input/output, and a column decoder for selecting a column of data input or output, the bitline sense AMP/driver stage comprising:

a driving controller for receiving a block write signal and sense AMP driving control signal and interrupting the bias potential of a PMOS transistor and an NMOS transistor during block write so as to reduce power consumed during block write;

a first driver for receiving the output of the driving controller and thus controlling the turning ON/OFF of the PMOS transistor; and a second driver for receiving the output of the driving controller and thus controlling the turning ON/OFF of the NMOS transistor.

5. The bitline sense AMP/driver stage as claimed in claim 4, wherein:

the MOS transistor whose bias potential is interrupted by the driving controller may interrupt all or part of bit line sense AMP drivers intersecting with one wordline.

6. A bitline sense AMP/driver stage for use in a synchronous graphic RAM having a data input/output portion, the bitline sense AMP/driver stage for amplifying the data input/output, and a column decoder for selecting a column of data input or output, the bitline sense AMP/driver stage comprising:

a driving controller for receiving a block write signal and sense AMP driving control signal and interrupting the bias potential of a first PMOS transistor and a first NMOS transistor during block write so as to reduce power consumed during block write;

a first driver for receiving the output of the driving controller and thus controlling the turning ON/OFF of the first PMOS transistor;

a second driver for receiving the sense AMP driving control signal and thus controlling the turning ON/OFF of a second PMOS transistor;

a third driver for receiving the sense AMP driving control signal and thus controlling the turning ON/OFF of the first NMOS transistor; and a fourth driver for receiving the output of the driving controller and thus controlling the turning ON/OFF of a second NMOS transistor.

7. The bitline sense AMP/driver stage as claimed in claim 6, wherein:

the second PMOS transistor is smaller than the first PMOS transistor, and the second NMOS transistor is smaller than the first NMOS transistor.

* * * * *